US010595435B2

(12) United States Patent
Chen

(10) Patent No.: US 10,595,435 B2
(45) Date of Patent: Mar. 17, 2020

(54) SERVER RAIL AND SERVER RACK MOUNTING STRUCTURE

(71) Applicant: Gslide Corporation, New Taipei (TW)

(72) Inventor: Yung-Liang Chen, New Taipei (TW)

(73) Assignee: Gslide Corporation, New Taipei (TW)

( * ) Notice: Subject to any disclaimer, the term of this patent is extended or adjusted under 35 U.S.C. 154(b) by 0 days.

(21) Appl. No.: 16/149,833

(22) Filed: Oct. 2, 2018

(65) Prior Publication Data

US 2019/0373758 A1 Dec. 5, 2019

(51) Int. Cl.
*H05K 7/18* (2006.01)
*A47B 88/483* (2017.01)
*A47B 88/43* (2017.01)

(52) U.S. Cl.
CPC ............ *H05K 7/183* (2013.01); *A47B 88/43* (2017.01); *A47B 88/483* (2017.01); *A47B 2210/0002* (2013.01)

(58) Field of Classification Search
CPC ....... A47B 88/423; A47B 88/43; H05K 7/183
See application file for complete search history.

(56) References Cited

U.S. PATENT DOCUMENTS

| 7,703,734 | B2 | 4/2010 | Chen et al. |
| 8,602,255 | B2 | 12/2013 | Lin et al. |
| 9,125,489 | B2 | 9/2015 | Chen et al. |
| 9,370,120 | B2 | 6/2016 | Chen et al. |
| 9,377,049 | B2 | 6/2016 | Hwang |
| 9,480,183 | B2 | 10/2016 | Chen et al. |
| 9,670,956 | B2 | 6/2017 | Judge |
| 9,801,467 | B2 * | 10/2017 | Chen ...................... A47B 88/43 |
| 9,854,908 | B1 | 1/2018 | Tang |
| 9,854,911 | B1 * | 1/2018 | Chang .................. A47B 96/068 |
| 9,918,404 | B1 | 3/2018 | Chen |
| 10,051,759 | B1 | 8/2018 | Chen |
| 10,278,498 | B2 * | 5/2019 | Chen ..................... H05K 7/1489 |
| 2003/0111436 | A1 | 6/2003 | Basinger et al. |
| 2009/0261699 | A1 | 10/2009 | Yu et al. |
| 2011/0101833 | A1 * | 5/2011 | Olesiewicz ............ H05K 7/183 312/223.2 |

(Continued)

FOREIGN PATENT DOCUMENTS

EP 2896324 A1 * 7/2015 ........... H05K 7/1489
TW I305138 5/2008

(Continued)

OTHER PUBLICATIONS

U.S. Appl. No. 16/149,593, filed Oct. 2, 2018.

*Primary Examiner* — Daniel J Rohrhoff
(74) *Attorney, Agent, or Firm* — Gardner, Linn, Burkhart & Ondersma LLP

(57) ABSTRACT

A server rail and server rack mounting structure includes a server rail, a server rack having a plurality of locating holes, a mounting bracket located at one end of an outer rail portion of the server rail and having a plurality of mounting rods respectively plugged into respective locating holes of the server rack and an abutment wall neighbored to the mounting rods, a swivel control member comprising a stop wall, a pivot member pivotally connect one end of the swivel control member to the mounting bracket and a torsion spring mounted around the pivot member and stopped between the mounting bracket and the swivel control member.

8 Claims, 7 Drawing Sheets

(56) References Cited

U.S. PATENT DOCUMENTS

| | | | |
|---|---|---|---|
| 2011/0135224 A1 | 6/2011 | Chen et al. | |
| 2011/0192946 A1 | 8/2011 | Yu et al. | |
| 2011/0240580 A1 | 10/2011 | Yu et al. | |
| 2012/0193489 A1 | 8/2012 | Yu et al. | |
| 2015/0201754 A1* | 7/2015 | Chen | A47B 96/025 248/219.3 |
| 2017/0079427 A1* | 3/2017 | Chen | A47B 88/423 |
| 2018/0098626 A1* | 4/2018 | Chen | A47B 88/43 |
| 2018/0220797 A1* | 8/2018 | Chen | A47B 88/423 |
| 2018/0360212 A1* | 12/2018 | Chen | A47B 88/423 |

FOREIGN PATENT DOCUMENTS

| | | |
|---|---|---|
| TW | M427756 | 4/2012 |
| TW | I517807 | 3/2014 |
| TW | I489931 | 6/2015 |
| TW | M509508 | 9/2015 |
| TW | M516294 | 1/2016 |
| TW | I573518 | 3/2017 |
| TW | I589214 | 4/2017 |
| TW | I608780 | 12/2017 |

* cited by examiner

SERVER RAIL AND SERVER RACK MOUNTING STRUCTURE

FIELD OF THE INVENTION

The present invention relates to server technology and, more particularly, to a server rail and server rack mounting structure.

BACKGROUND OF THE INVENTION

Taiwan Patent Number I624235, issued to the present inventor, discloses a server rail front bracket quick release structure for quick connection of the outer rail of the server rail to the server rack. This design of server rail front bracket quick release structure uses a large number of component parts such as front bracket, connection block, swivel hook, pivot member, retainer, lever, outer socket, inner lock pin, springs, and etc. In installation, it requires much labor and time, increasing the installation cost.

Other designs for mounting a server rail to a server rack are seen in Taiwan Patent Number I608780 entitled "Server and modem rack mounting structure (III)"; Taiwan Patent Number I573518 entitled "Server rail bracket assembly"; Taiwan Patent Number I427756 entitled "Server and modem rack mounting structure (II)"; Taiwan Patent Number I305138 entitled "Front-mount sliding rail bracket assembly".

SUMMARY OF THE INVENTION

An object of the present invention to provide a server rail and server rack mounting structure, which enables an outer rail portion of the server rail to be conveniently installed on the server rack by means of a mounting bracket and a swivel control member without tools.

It is another object of the present invention to provide a server rail and server rack mounting structure, which enables an abutment wall of the mounting bracket to be abutted against an inner surface of the server rack and an outer surface of the server rack to be abutted against a stop wall of the swivel control member after installation, enhancing installation stability.

It is still another object of the present invention to provide a server rail and server rack mounting structure, wherein the stop wall of the swivel control member provides at least one through hole and the mounting bracket provides at least one screw hole corresponding to the at least one through hole for the mounting of at least one screw to lock the swivel control member, the server rack and the mounting bracket together.

It is still another object of the present invention to provide a server rail and server rack mounting structure, which uses a less number of component parts, facilitating installation.

According to one form of the present invention, a server rail and server rack mounting structure comprises a server rail, a server rack having a plurality of locating holes at one side thereof, a mounting bracket located at one end of an outer rail portion of the server rail and comprising a plurality of mounting rods respectively plugged into respective locating holes of the server rack and an abutment wall neighbored to the mounting rods, a swivel control member comprising a stop wall, a pivot member pivotally connect one end of the swivel control member to the mounting bracket and a torsion spring mounted around the pivot member with one end thereof stopped against the mounting bracket and an opposite end thereof stopped against the swivel control member. When using the mounting bracket to mount the server rail to the server rack, the swivel control member is biased in a direction away from the mounting bracket, and the mounting rods of the mounting bracket are then plugged into respective locating holes of the server rack to let the abutment wall of the mounting bracket be stopped against an inner surface of the server rack around the locating holes. The pressure is then released from the swivel control member, allowing the swivel control member to return back to the mounting bracket by the elastic restoring energy of the torsion spring, whereupon the stop wall of the swivel control member is abutted against an opposing outer surface of the server rack, the abutment wall of the mounting bracket is abutted against the inner surface of the server rack, and the outer surface of the server rack is abutted against the stop wall of the swivel control member, enhancing mounting stability.

These and other objects, advantages and features of the invention will become apparent upon review of the following specification in conjunction with the drawings.

DETAILED DESCRIPTION OF THE PREFERRED EMBODIMENTS

Figure 1:
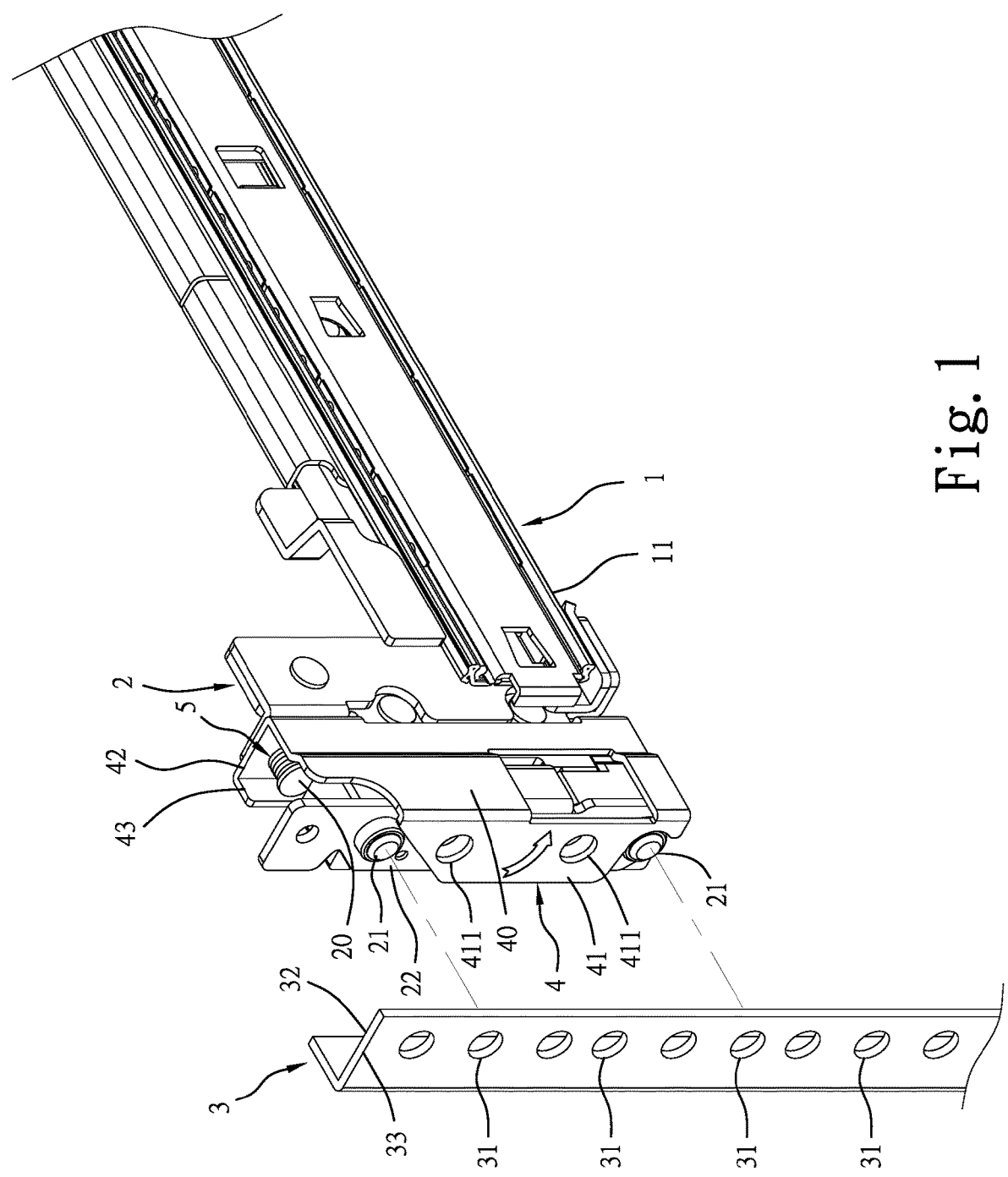
FIG. 1 is an upper perspective view of a server rail and server rack mounting structure in accordance with the present invention, shown before installation on a server rack.

Referring to FIGS. 1-7, a server rail and server rack mounting structure comprises a server rail 1, a server rack 3 having a plurality of locating holes 31 at one side thereof, and a mounting bracket 2 located at one end of an outer rail portion 11 of the server rail 1 and comprising a plurality of mounting rods 21 that are configured to be respectively plugged into respective locating holes 31 of the server rack 3, and an abutment wall 22 neighbored or adjacent to the mounting rods 21.

The main features of the server rail 1 and server rack mounting structure include a swivel control member 4, a pivot member 20 pivotally connect one end of the swivel control member 4 to the mounting bracket 2, and a torsion spring 5 mounted around the pivot member 20 with one end 51 stopped against the mounting bracket 2 and an opposite end 52 thereof stopped against the swivel control member 4 (FIGS. 1 and 4-6). Further, the swivel control member 4 comprises a stop wall 41.

Figure 2:
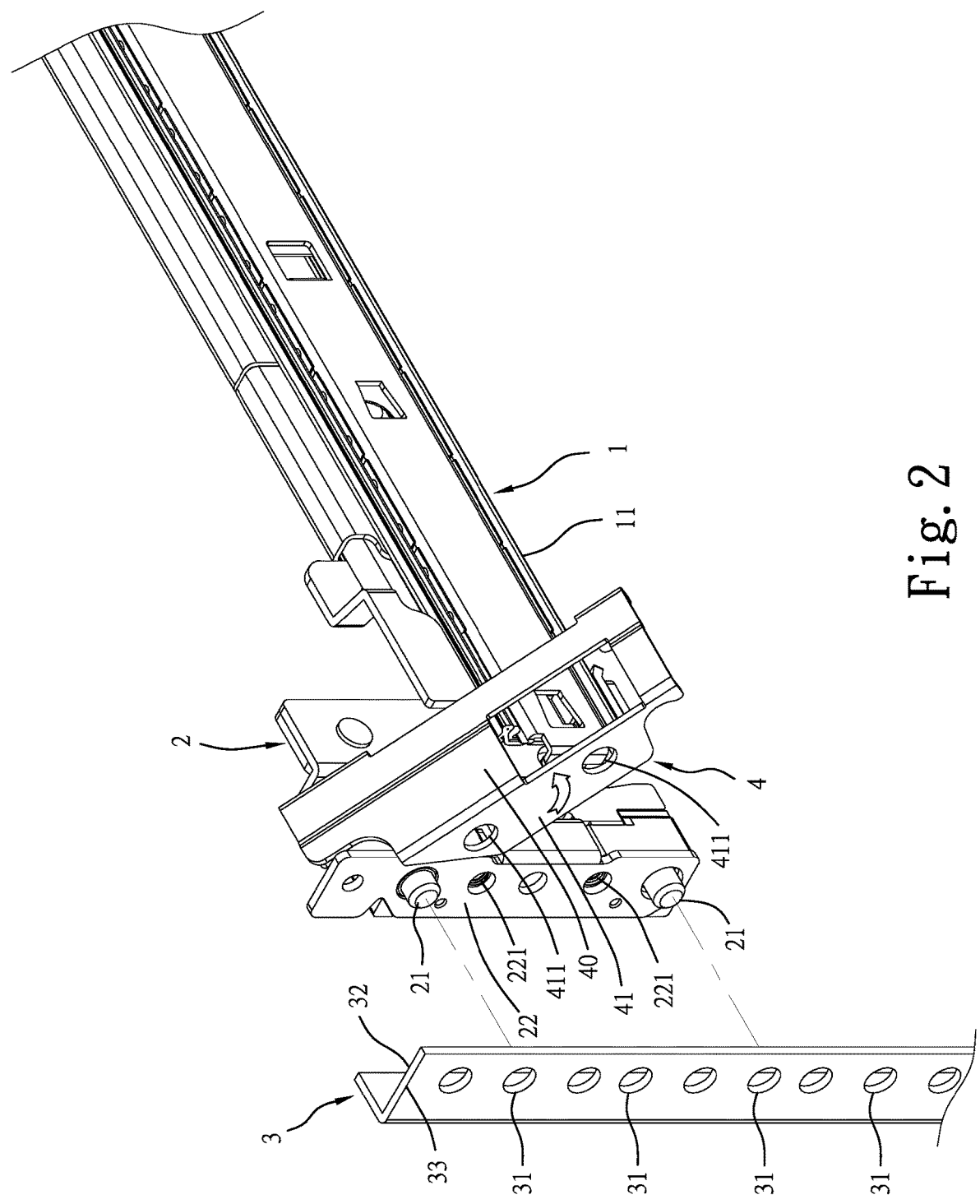
FIG. 2 is another perspective view generally corresponding to FIG. 1, illustrating the swivel control member in a biased configuration.
Figure 3:
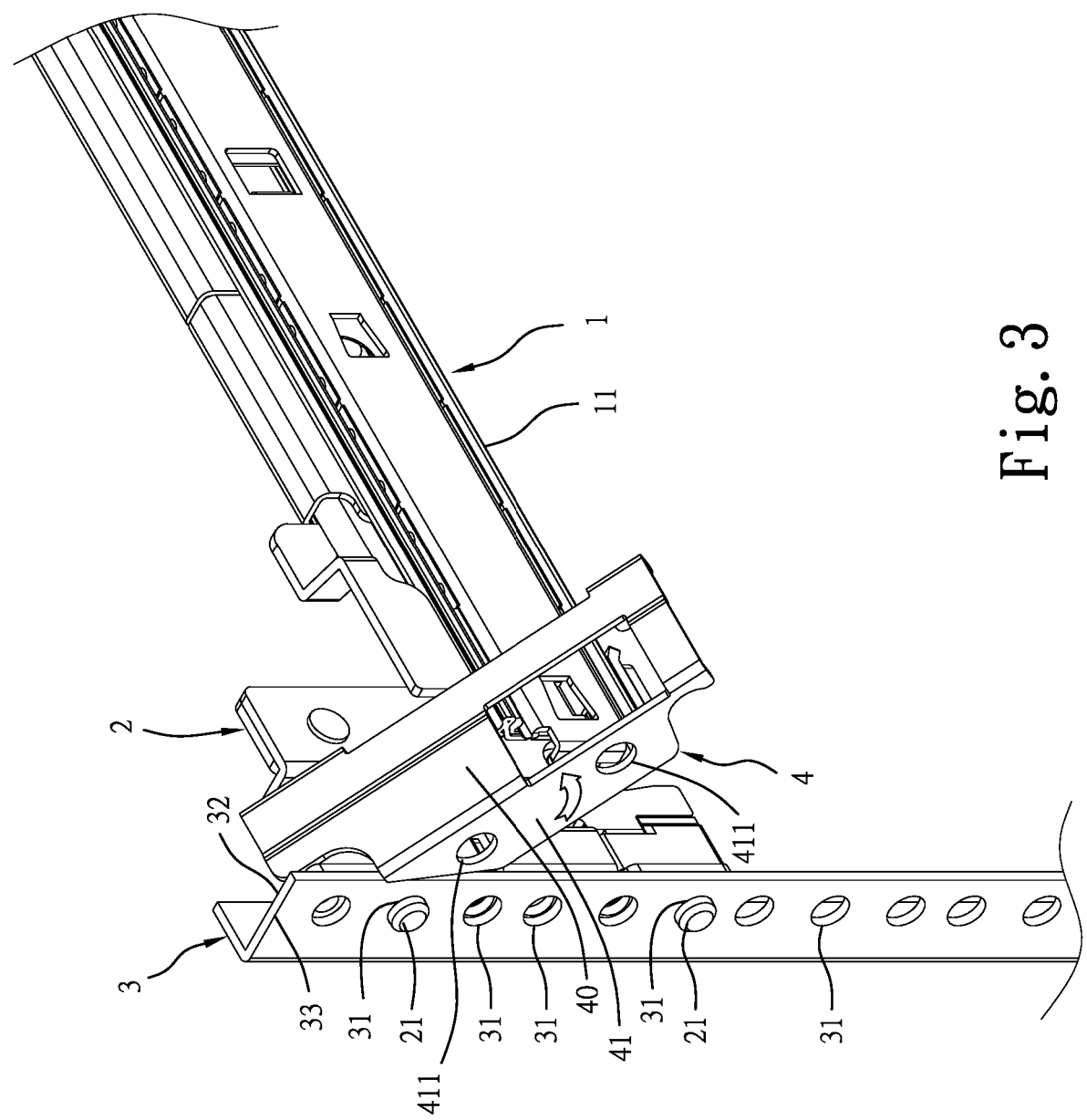
FIG. 3 is another perspective view generally corresponding to FIG. 2, illustrating the mounting rods of the mounting bracket plugged into respective locating holes of the server rack.
Figure 4:
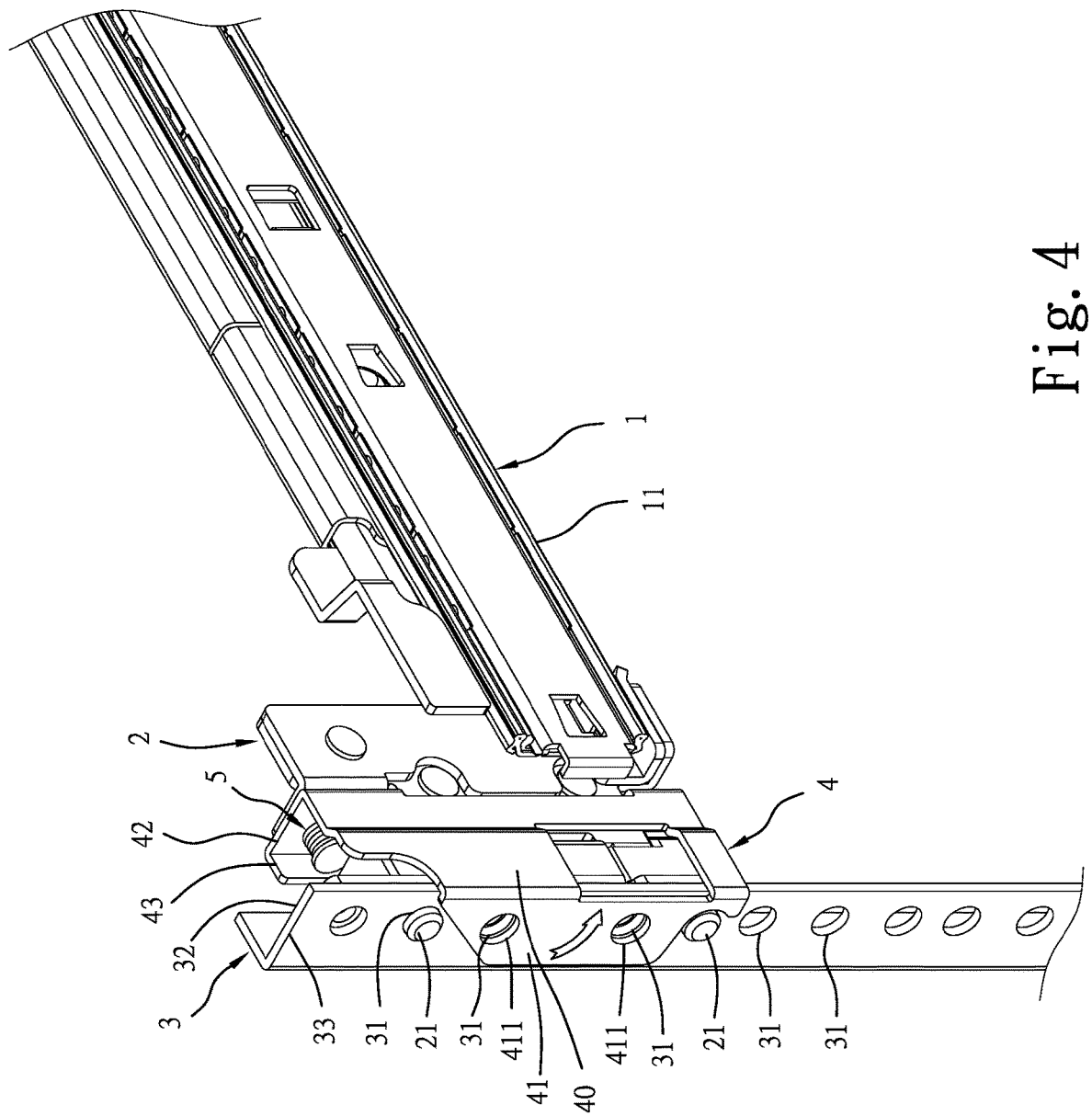
FIG. 4 is another perspective view generally corresponding to FIG. 3, illustrating the swivel control member returned to its former position with the stop wall of the swivel control member abutted against the opposing outer surface of the server rack.
Figure 5:
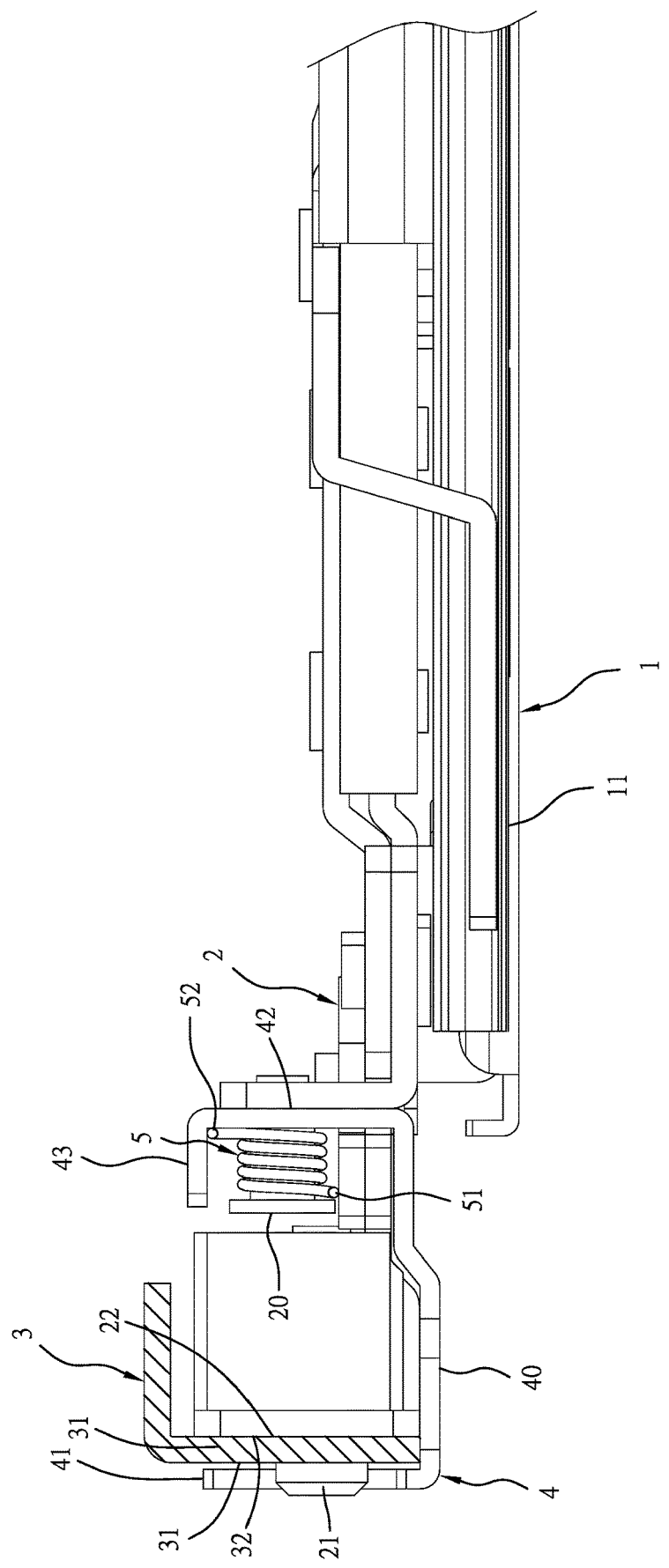
FIG. 5 is an enlarged sectional top view of the server rail and server rack mounting structure shown in FIG. 4.

When using the mounting bracket 2 to mount the server rail 1 to the server rack 3, the swivel control member 4 is biased in the direction away from the mounting bracket 2 (FIG. 2). The mounting rods 21 of the mounting bracket 2 are plugged into respective locating holes 31 of the server rack 3 (FIG. 3) to let the abutment wall 22 of the mounting bracket 2 be stopped against an inner surface 32 of the server rack 3 around the locating holes 31. The pressure is released from the swivel control member 4 for letting the swivel control member 4 be returned back to the mounting bracket 2 by the elastic restoring energy of the torsion spring 5, so that the stop wall 41 of the swivel control member 4 is abutted against an opposing outer surface 33 of the server rack 3 (FIGS. 4 and 5). Thus, the installation is done. After installation, the abutment wall 22 of the mounting bracket 2 is abutted against the inner surface 32 of the server rack 3 and the outer surface 33 of the server rack 3 is abutted against the stop wall 41 of the swivel control member 4, enhancing stability of the installation.

Figure 6:
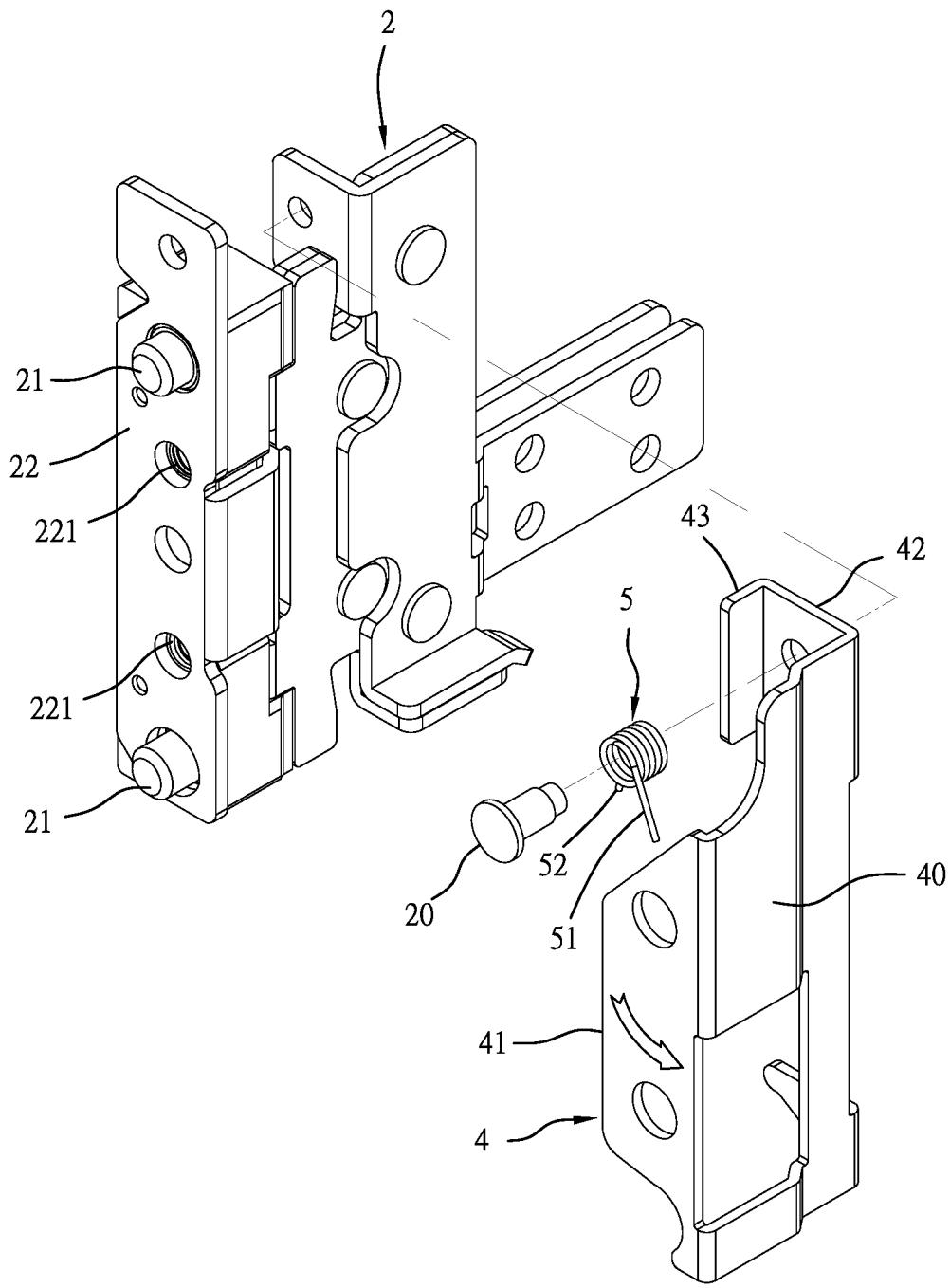
FIG. 6 is an exploded view of the mounting bracket and the swivel control member.
Figure 7:
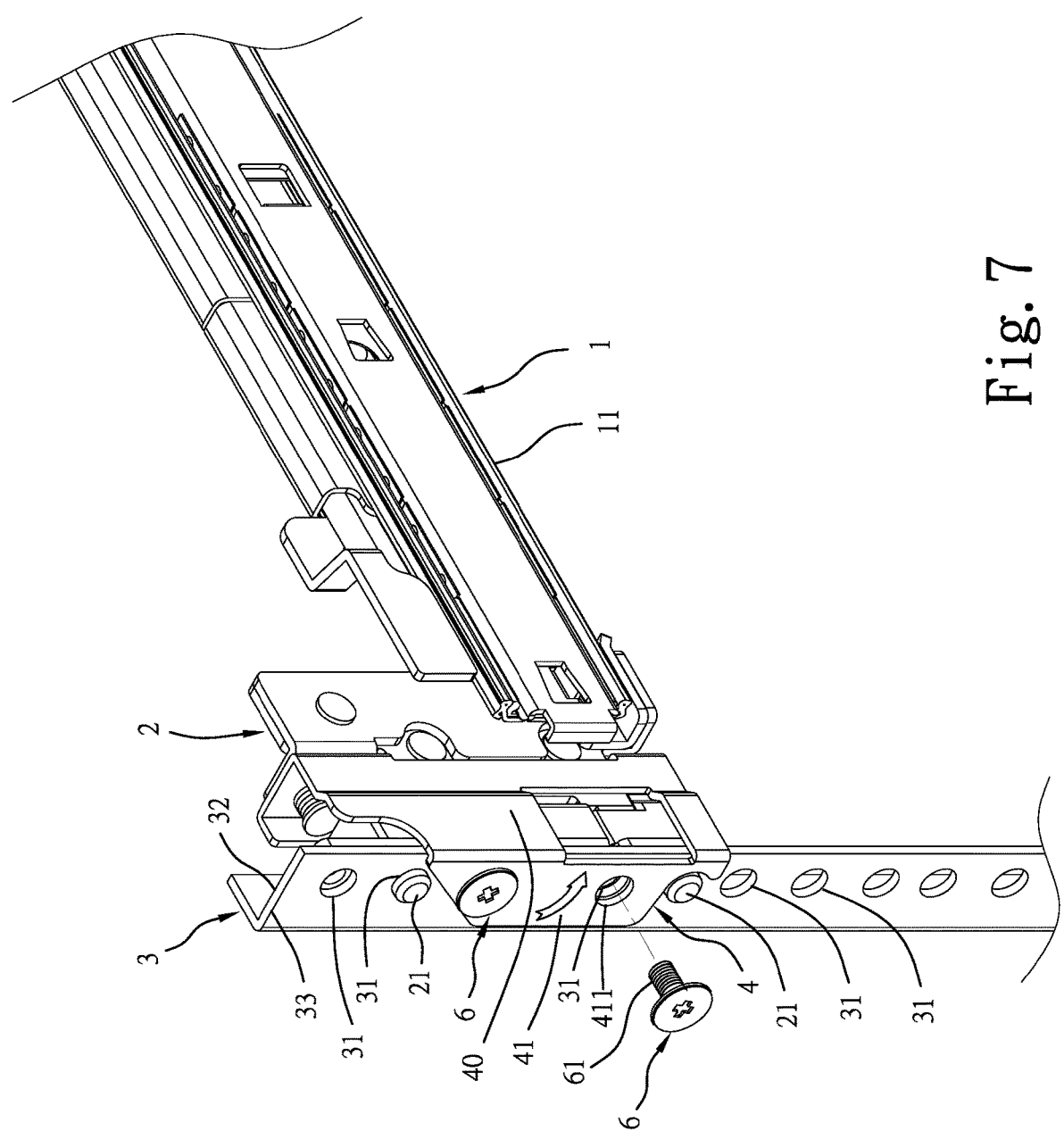
FIG. 7 is another perspective view generally corresponding to FIG. 4, illustrating screws mounted in the swivel control member, the server rack and the mounting bracket.

Optionally, the swivel control member 4 further comprises at least one through hole 411 located on the stop wall 41. The mounting bracket 2 defines or comprises at least one screw hole 221 corresponding to the at least one through hole 411 of the stop wall 41 (FIGS. 2 and 6). A screw 6 is inserted through each through hole 411 on the stop wall 41 of the swivel control member 4, and through one respective locating hole 31 of the server rack 3, with a threaded shank 61 of the screw 6 threaded into one respective screw hole 221 of the mounting bracket 2 (FIG. 7) to lock or secure the swivel control member 4, the server rack 3 and the mounting bracket 2 together.

Referring to FIG. 6, the swivel control member 4 comprises a main wall 40 with its one lateral side connected to the stop wall 41, a second wall 42 connected to an opposite lateral side of the main wall 40, and a third wall 43 perpendicularly connected to the second wall 42 and disposed in parallel to the main wall 40 for the abutment of the opposite end 52 of the torsion spring 5.

Accordingly, it will be appreciated that the outer rail portion 11 of the server rail 1 can be conveniently installed on the server rack 3 by means of the mounting bracket 2 and the swivel control member 4, optionally without tools. After installation, the abutment wall 22 of the mounting bracket 2 is abutted against the inner surface 32 of the server rack 3 and the outer surface 33 of the server rack 3 is abutted against the stop wall 41 of the swivel control member 4, enhancing installation stability. The stop wall 41 of the swivel control member 4 provides at least one through hole 411 and the mounting bracket 2 provides at least one screw hole 221 corresponding to the at least one through hole 411 for the mounting of at least one screw 6 to lock the swivel control member 4, the server rack 3 and the mounting bracket 2 together. It will be appreciated that the server rail and server rack mounting structure uses fewer component parts than typical systems, thus facilitating installation.

Although particular embodiments of the invention have been described in detail for purposes of illustration, various modifications and enhancements may be made without departing from the spirit and scope of the invention. Accordingly, the invention is not to be limited except as by the appended claims as interpreted according to the principles of patent law including the doctrine of equivalents.

The invention claimed is:

1. A server rail and server rack mounting structure comprising:
   a server rail including an outer rail portion;
   a server rack having a plurality of locating holes at one side thereof;
   a mounting bracket located at one end of said outer rail portion of said server rail, said mounting bracket comprising a plurality of mounting rods configured to be respectively plugged into respective ones of said locating holes of said server rack, and an abutment wall adjacent said mounting rods; and
   said server rail and server rack mounting structure further comprising a swivel control member having a stop wall, a pivot member pivotally connecting one end of said swivel control member to said mounting bracket, and a torsion spring mounted around said pivot member and having one end thereof stopped against said mounting bracket and an opposite end thereof stopped against said swivel control member;
   wherein said swivel control member is configured to be biased in a direction away from said mounting bracket;
   said swivel control member further comprising a main wall with one lateral side thereof connected to said stop wall, a second wall connected to an opposite lateral side of said main wall, and a third wall perpendicularly connected to said second wall and disposed in parallel to said main wall for the abutment of said opposite end of said torsion spring;
   wherein said mounting rods of said mounting bracket are configured to be plugged into respective said locating holes of said server rack to let said abutment wall of said mounting bracket be stopped against an inner surface of said server rack around said locating holes; and
   wherein releasing pressure from said swivel control member allows said swivel control member to be returned back to said mounting bracket by the elastic restoring energy of said torsion spring until (1) said stop wall of said swivel control member is abutted against an opposing outer surface of said server rack, (2) said abutment wall of said mounting bracket is abutted against said inner surface of said server rack, and (3) said outer surface of said server rack is abutted against said stop wall of said swivel control member.

2. A server rail and server rack mounting structure comprising:
   a server rail including an outer rail portion;
   a server rack having a plurality of locating holes at one side thereof;
   a mounting bracket located at one end of said outer rail portion of said server rail, said mounting bracket comprising a plurality of mounting rods configured to be respectively plugged into respective ones of said locating holes of said server rack, and an abutment wall adjacent said mounting rods;
   said server rail and server rack mounting structure further comprising a swivel control member having a stop wall, a pivot member pivotally connecting one end of said swivel control member to said mounting bracket, and at least one through hole defined through said stop wall; and
   said mounting bracket comprises at least one screw hole corresponding to said at least one through hole of said swivel control member;
   wherein a screw is inserted through each said through hole of said swivel control member and a respective one of said locating holes of said server rack, with a threaded shank of the screw threaded into a respective one of said screw holes of said mounting bracket to thereby secure said swivel control member, said server rack and said mounting bracket together;

wherein said swivel control member is configured to be biased in a direction away from said mounting bracket;

wherein said mounting rods of said mounting bracket are configured to be plugged into respective said locating holes of said server rack to let said abutment wall of said mounting bracket be stopped against an inner surface of said server rack around said locating holes; and wherein releasing pressure from said swivel control member allows said swivel control member to be returned back to said mounting bracket until (1) said stop wall of said swivel control member is abutted against an opposing outer surface of said server rack, (2) said abutment wall of said mounting bracket is abutted against said inner surface of said server rack, and (3) said outer surface of said server rack is abutted against said stop wall of said swivel control member.

3. The server rail and server rack mounting structure as claimed in claim 2, wherein said swivel control member comprises:

a main wall with one lateral side thereof connected to said stop wall;

a second wall connected to an opposite lateral side of said main wall; and a third wall perpendicularly connected to said second wall and disposed in parallel to said main wall for the abutment of a torsion spring.

4. The server rail and server rack mounting structure as claimed in claim 3, wherein said swivel control member further comprises said torsion spring mounted around said pivot member and having one end thereof stopped against said mounting bracket and an opposite end thereof stopped against said swivel control member.

5. The server rail and server rack mounting structure as claimed in claim 2, wherein said swivel control member further comprises a torsion spring mounted around said pivot member and having one end thereof stopped against said mounting bracket and an opposite end thereof stopped against said swivel control member.

6. The server rail and server rack mounting structure as claimed in claim 2, wherein said swivel control member is pivotable about a horizontal axis that extends through said server rack and through a proximal portion of said swivel control member.

7. A server rail and server rack mounting structure comprising:

a server rail including an outer rail portion;

a server rack having a plurality of locating holes at one side thereof;

a mounting bracket located at one end of said outer rail portion of said server rail, said mounting bracket comprising a plurality of mounting rods configured to be respectively plugged into respective ones of said locating holes of said server rack, and an abutment wall adjacent said mounting rods; and said server rail and server rack mounting structure further comprising a swivel control member having a stop wall, a pivot member pivotally connecting one end of said swivel control member to said mounting bracket, and a biasing element;

wherein said swivel control member is pivotable about a horizontal axis that extends through said server rack and through a proximal portion of said swivel control member, wherein a distal end of said swivel control member is configured to be manually biased in a direction laterally and vertically away from said mounting bracket;

wherein said mounting rods of said mounting bracket are configured to be plugged into respective said locating holes of said server rack to let said abutment wall of said mounting bracket be stopped against an inner surface of said server rack around said locating holes; and wherein releasing pressure from said swivel control member allows said swivel control member to be returned back to said mounting bracket by the elastic restoring energy of said biasing element until (1) said stop wall of said swivel control member is abutted against an opposing outer surface of said server rack, (2) said abutment wall of said mounting bracket is abutted against said inner surface of said server rack, and (3) said outer surface of said server rack is abutted against said stop wall of said swivel control member.

8. The server rail and server rack mounting structure as claimed in claim 7, wherein said biasing element comprises a torsion spring mounted around said pivot member and having one end thereof stopped against said mounting bracket and an opposite end thereof stopped against said swivel control member.

* * * * *